United States Patent [19]

Anthony et al.

[11] 3,998,662
[45] Dec. 21, 1976

[54] MIGRATION OF FINE LINES FOR BODIES OF SEMICONDUCTOR MATERIALS HAVING A (100) PLANAR ORIENTATION OF A MAJOR SURFACE

[75] Inventors: Thomas R. Anthony; Harvey E. Cline; Douglas E. Houston, all of Schenectady, N.Y.

[73] Assignee: General Electric Company, Schenectady, N.Y.

[22] Filed: Dec. 31, 1975

[21] Appl. No.: 645,674

[52] U.S. Cl. .................. 148/1.5; 148/171; 148/172; 148/177; 148/179; 148/186; 148/187; 148/188; 252/62.3 GA; 252/62.3 E
[51] Int. Cl.² ................................ H01L 21/228
[58] Field of Search .......... 148/1.5, 171, 172, 177, 148/179, 186, 187, 188; 252/62.3 GA, 62.3 E

[56] References Cited
UNITED STATES PATENTS

| | | | |
|---|---|---|---|
| 2,813,048 | 11/1957 | Pfann | 148/1 |
| 3,897,277 | 7/1975 | Blumenfeld | 148/1.5 |
| 3,898,106 | 8/1975 | Cline et al. | 148/1.5 |
| 3,899,361 | 8/1975 | Cline et al. | 148/1.5 |
| 3,899,362 | 8/1975 | Cline et al. | 148/1.5 |
| 3,901,736 | 8/1975 | Anthony et al. | 148/1.5 |
| 3,902,925 | 9/1975 | Anthony et al. | 148/1.5 |
| 3,904,442 | 9/1975 | Anthony et al. | 148/1.5 |
| 3,910,801 | 10/1975 | Cline et al. | 148/1.5 |
| 3,936,319 | 2/1976 | Anthony et al. | 148/187 X |
| 3,956,023 | 5/1976 | Cline et al. | 148/1.5 |

*Primary Examiner*—G. Ozaki
*Attorney, Agent, or Firm*—Donald M. Winegar; Joseph T. Cohen; Jerome C. Squillaro

[57] ABSTRACT

Metal wires of widths as small as 10 microns are successfully migrated by thermal gradient zone melting processing as a molten zone through a body of semiconductor material. The metal wires are migrated to a preselected depth without use of oxide masking and/or etched grooves when the planar orientation of the surface of the body is (100).

21 Claims, 10 Drawing Figures

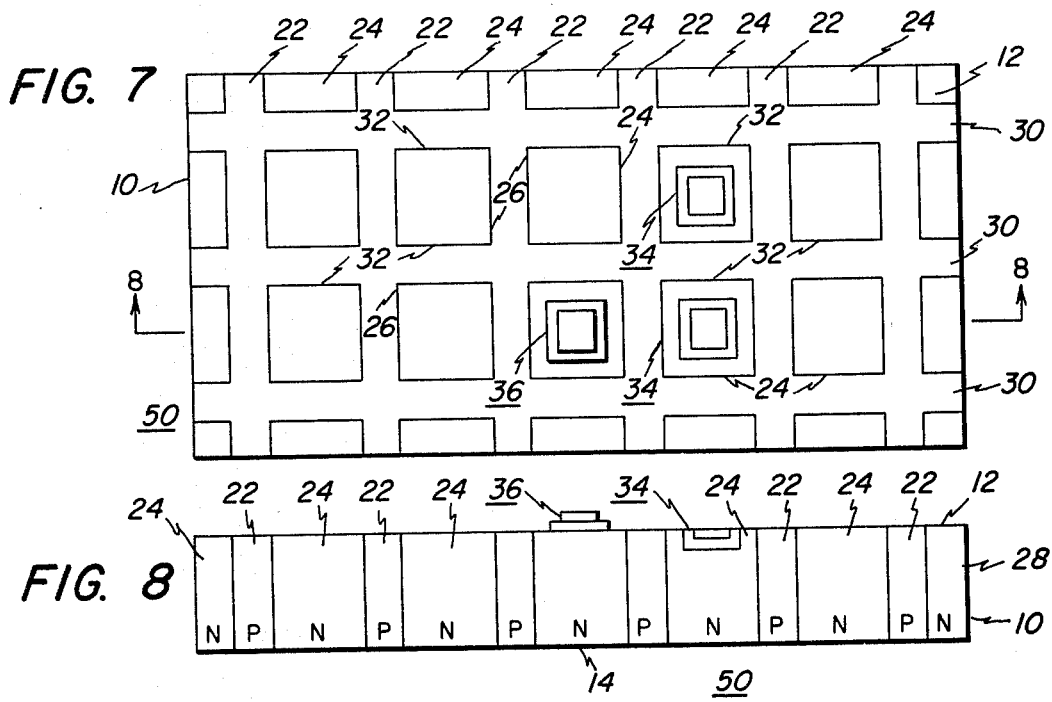
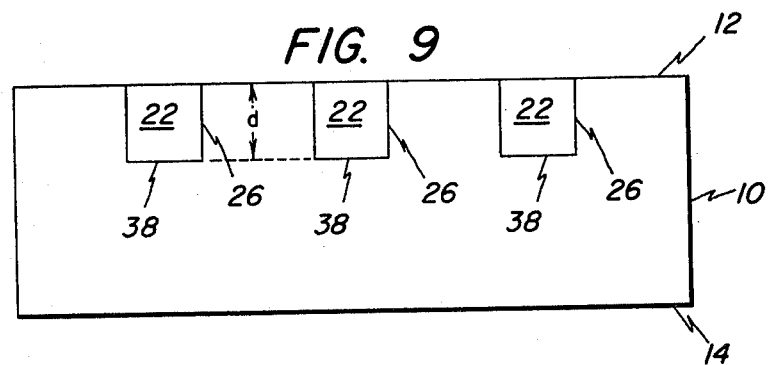
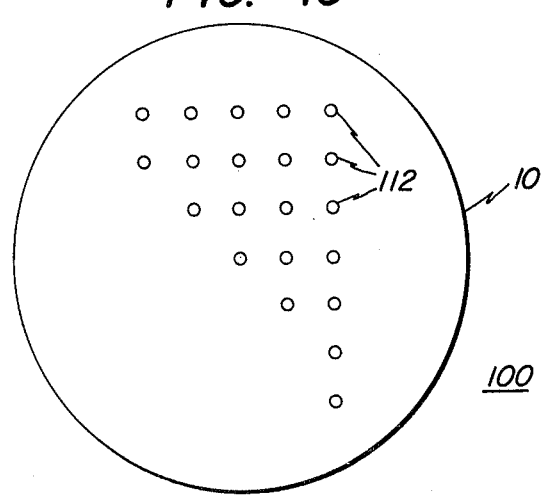

MIGRATION OF FINE LINES FOR BODIES OF SEMICONDUCTOR MATERIALS HAVING A (100) PLANAR ORIENTATION OF A MAJOR SURFACE

BACKGROUND OF THE INVENTION

1. Field of the Invention

This invention relates to a method of moving a molten zone of material through a solid body of semiconductor material and, in particular, to the migration of a metal "wire" through material, having a diamond cubic crystal structure and at least one surface of the body has a (100) planar orientation.

2. Description of the Prior Art

W. G. Pfann describes in "Zone Melting", John Wiley and Sons, Inc., New York (1966), a thermal gradient zone melting process to produce various desirable material configurations in a body of semiconductor material. The process had previously been disclosed in his issued U.S. Pat. No. 2,813,048, based on his application filed June 24, 1954. In both instances, cavities are generally formed in the surface of the body and a piece of wire of the metal to be migrated is disposed in the cavity. However, the resulting structures were not desirable for semiconductor usage.

M. Blumenfeld, in U.S. Pat. No. 3,897,277, teaches alloying aluminum to the surface of a body of silicon semiconductor material in an attempt to maintain the registry of the pattern of metal deposits to be migrated. However, problems of registry of the metal still plague one's attempt to obtain the precise orientation necessary for an array of deep diodes suitable for making X-ray imaging devices.

Recently, T. R. Anthony and H. E. Cline, discovered that employing selected etching of the surface and preferred crystallographic orientation enabled one to employ thermal gradient zone melting processing to make semiconductor devices commercially. The improved process resulted in a large savings in energy required to process semiconductor materials and increased the yields of devices fabricated thereby. For further information, one is directed to the teachings of Anthony and Cline in their recently granted U.S. Pat. No. 3,904,442, and co-pending patent application Ser. No. 519,913.

A wafer thickness of from 6 mils to 10 mils or more is most often employed because of handling problems encountered in semiconductor processing. The requirement of etching grooves to deposit metal therein for subsequent migration may lead to wafer breakage if personnel abuse the wafers in their handling required during processing. Additionally, it is desirable to minimize the required processing steps of the wafers since each step enhances the chance of some undesirable happening occurring to the wafer as it is processed.

In a co-pending application, Ser. No. 634,247 filed Nov. 21, 1975; Chang, Cline and Anthony, describe a method of using an oxide mask to initiate the migration process. Elimination of this step is also desirable, if practical, should it have the ability to be reproducible on a commercial scale.

It is therefore an object of this invention to provide a new and improved method for moving a molten zone within a solid body, or wafer, of semiconductor material which overcomes the deficiencies of the prior art.

Another object of this invention is to provide a new and improved method of migrating a molten zone of a metal-rich semiconductor material through a solid body or wafer, of semiconductor material without the use of etched grooves and/or oxide masking on the surface of the wafer or body.

Other objects of this invention will, in part, be obvious and will, in part, appear hereinafter.

BRIEF DESCRIPTION OF THE INVENTION

In accordance with the teachings of this invention, there is provided an improved method for the migration of a molten zone through a solid body of semiconductor material to form a region of recrystallized semiconductor material of the body therein. In particular, the improved method is preferred for forming regions as small as 10 microns in width or diameter. The process steps of the improved method include selecting a body of single crystal semiconductor material having two major opposed surfaces being respectively the top and bottom surfaces thereof. The body has a preferred crystallographic structure, a planar orientation of (100) for at least the top surface, a first selected type conductivity and a selected level of resistivity. The body also has a vertical axis which is substantially aligned with the $<100>$ axis of the crystal structure and which is also substantially perpendicular to the top surface.

At least one mass of metal is deposited on the top surface of the body. The mass may have a disk-like configuration or a linear configuration. Should the metal have a linear configuration, the longitudinal axis is substantially aligned with the $<011>$ or $<0\bar{1}1>$ wire direction. The metal itself may be of one or more different materials to produce the desired physical characteristics of the region of semiconductivity to be formed by thermal gradient zone melting. Preferably, the mass of metal is deposited onto the surface by any suitable means which produces a substantially oxygen-free mass of metal. No mask, sintering, alloying, or etching, of the surface is required to help initiate migration of the melt of the metal.

The body and the deposited metals are then heated to a preselected elevated temperature sufficient to form a melt of a metal-rich semiconductor material on the surface of the body. A temperature gradient is then established substantially parallel with the vertical axis of the body and the $<100>$ axis of the crystal structure thereof. The surface on which the melt is formed is maintained at the lower temperature. Thereafter, each melt of metal-rich semiconductor material is moved as a molten zone through the solid body of semiconductor material. The process is practiced for a sufficient period of time to reach a predetermined depth in the body from the top surface. The process may be practiced to move the molten zone entirely through the body from one surface to the other or may be stopped between the surfaces and a reversed gradient imposed to move the molten zone, preferably along the same initial track, to the top surface. In either case, the movement of each molten zone through the solid body of semiconductor material of the body produces a region of recrystallized semiconductor material of the body having solid solubility of the deposited material therein. The region so produced also has a substantially uniform cross-sectional area and a substantially uniform level of resistivity throughout the entire region.

DESCRIPTION OF THE DRAWINGS

FIG. 7 is a top planar view of a grid structure embodying the teachings of this invention;

FIG. 8 is a side elevation view partly in cross-section of the body of FIG. 7 taken along the cutting plane 8—8;

FIG. 9 is an elevation view partly in cross-section of an alternate embodiment of the body of FIGS. 3 through 6, and FIG. 10 is a top planar view of an array of circular configurations suitable for making an x-ray imaging device.

DESCRIPTION OF THE INVENTION

Figure 1:
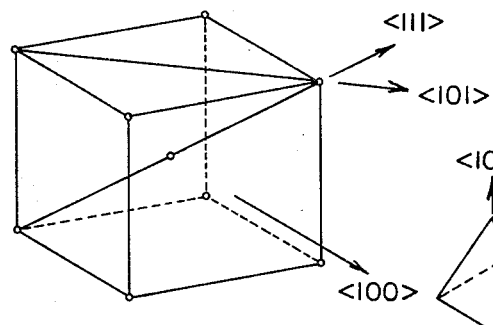
FIG. 1 is a diamond cubic crystal structure.

Referring now to FIG. 1, there is shown the diamond cubic crystal system of silicon, silicon carbide, germanium, gallium arsenide, and other semiconductor materials consisting of a compound of a Group II element and a Group VI element and a compound of a Group III element and a Group V element.

In order to practice the new improved thermal gradient zone melting process of this invention, it is necessary that the planar orientation of one of the two major opposed surfaces of the wafer of semiconductor material be (100). The (100) plane is that plane which coincides with a face of the unit cube. Other planar orientations usually suitable for the surface 12, but of no interest in this particular application, are the (110) plane and the (111) plane. The (110) plane is that plane which passes through a pair of diagonally opposite edges of the unit cube. Those planes which pass through a corner atom and through a pair of diagonally opposite atoms located in a face not containing the first mentioned atoms are generally identified as (111) planes. As a matter of convenience, directions in the unit cube which are perpendicular to each of these generic planes (X Y Z) are customarily referred to as the "crystal zone axis" of the particular planes involved, or more usually as the "X Y Z direction".

Figure 2:
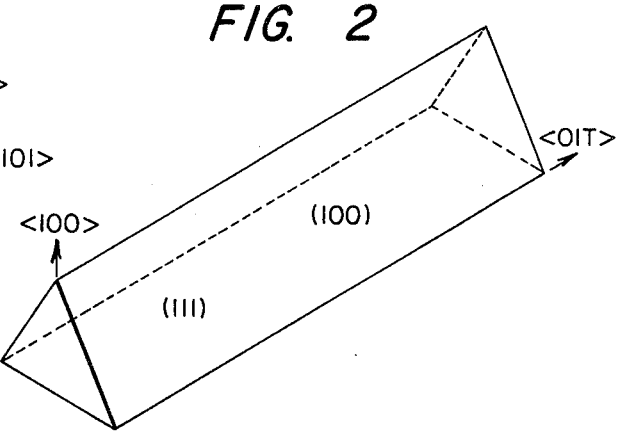
FIG. 2 is a morphological shape of wires which migrate stable in the $<100>$ direction.

The crystal zone axis of the (100) generic plane will be referred to as the < 100 > direction and the crystal zone axis of the (111) plane as the < 111 > direction, and to the crystal zone axis of the (110) plane as the < 110 > direction. Examples of these directions with respect to the unit cube are shown by the appropriately identified arrows in FIG. 1. In particular, for the (100) planar orientation, metal-rich wires of material can only be migrated stably in the < 100 > direction. In addition, only wires lying in the < 011 > and the < 0$\overline{1}$1 > directions are stable in migration in the < 100 > axis direction. The morphological shape of these stable metal-rich wires of material is shown in FIG. 2. Solid liquid surface tension causes coarsening of the ends of the stable metal-rich liquid wires.

Although lying in the same (100) planar region, wires of metal-rich liquid, which by lying in directions other than the < 011 > and < 0$\overline{1}$1 > directions, are unstable and break up into a row of pyramidal square-base droplets of metal-rich liquid material because of severe faceting of the solid-liquid interface of wires lying in these directions. Thus, for example, wires lying in the < 012 > and < 02$\overline{1}$ > directions are unstable.

The dimensions of the metal wires also influence the stability of the metal wires. Only metal wires which are no greater than 100 microns in width are stable during the migration of the wires in the < 100 > direction for a distance of at least 1 centimeter into the body of semiconductor material. Wire stability increases with decreasing wire size. The more the size of the liquid metal wire exceeds 100 microns, the less the distance that the liquid wire is able to penetrate the body during migration before the wire becomes unstable and breaks up.

A critical factor influencing the liquid metal and wire stability during migration is the parallelism of the applied thermal gradient to the < 100 > crystallographic direction. An off axis component of the thermal gradient in general decreases the stability of the migrating liquid by causing tooth-like, or serrated, facets to develop in the side faces of the wire. When the tooth-like facets become too large, the wire breaks up and loses its continuity.

To fabricate a grid structure wherein the planar region is (100) and the migration direction is < 100 >, it is necessary to migrate a first array of liquid wires through the body to form one group of spaced planar regions which are substantially perpendicular to, and intersect, the first group of spaced planar regions. Simultaneous migration of the liquid wires to form the two groups of regions most often results in discontinuities in the grid structure. Investigation of the reasons for the discontinuities indicates that the surface tension of the molten metal-rich material at the intersections of two migrating liquid wires is sufficiently great to cause discontinuities in the intersecting liquid wires. Apparently, the solid-liquid surface tension is sufficient to each portion of the intersecting migrating wires to cause the metal-rich liquid to remain with its own wire portion instead of being distributed uniformly throughout the intersection of the wires in the body. As a result, material of the body at the advancing interface of the supposedly intersecting wires does not become wetted by the liquid wires or even contacted by the liquid and therefore is not dissolved into the advancing metal-rich liquid, therefore, discontinuity occurs at the intersection and further advancement of the liquid wires produces an imperfect grid. In instances where the discontinuities of the grid is present, mutually adjacent regions of the conductivity types of the body 12, which are formed by the grid structure, are not electrically isolated from each other and may deleterious affect the reliability of electrical circuitry associated therewith.

Figure 3:
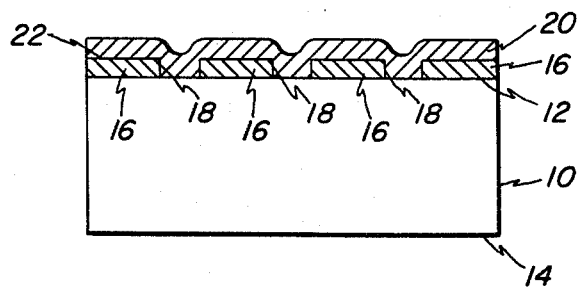
FIGS. 3 through 6 are side elevation views of a body of semiconductor material processed in accordance with the teachings of this invention.

With reference to FIG. 3, there is shown a body 10 of single semiconductor material having a selected level of resistivity and a first type conductivity. The body 10 has two opposed major surfaces 12 and 14 which are the top and bottom surfaces respectively thereof. At least the top surface 12 has a (100) planar orientation. The body 10 has a vertical axis which is substantially aligned with the < 100 > axis of the material of the body 10.

In order to describe the invention more completely, the material of the body 10 is said to be of silicon and the metal to be migrated is aluminum.

The body 10 is mechanically polished, chemically etched to remove any damaged surfaces, rinsed in deionized water and dried in air. Employing well known photolithographical techniques, a layer 16 of a photoresist material, such for example, as Kodak Metal Etch Resist, is disposed on the surface 12 of the body 10. The resist is dried by baking at a temperature of about 80° C. A suitable mask, of any of the materials well known to those skilled in the art defining one or more geometrical shapes such, for example, as a line or a dot, is disposed on the layer 16 of photoresist and exposed to ultraviolet light. The line must have a wire direction of $<011>$ or $<0\bar{1}1>$.

The layer 16 of photoresist is washed in xylene to open windows 18 in the layer or mask 16 thereby exposing one or more selective portions of the surface 12 therein, the selective portions having the preferred wire direction of $<011>$ or $<0\bar{1}1>$.

The processed body 10 is disposed in a metal evaporation chamber not shown. A layer 20 of at least one selected metal is disposed on the surface 22 of the layer 20 of the photoresist and the selective surface areas of the surface 12 of exposed silicon in the windows 18 of the layer 16. The material comprising the layer 20 is the metal wire or droplets or both to be migrated by a thermal gradient zone melting process either entirely through the body 10 or to a predetermined distance into the body 10 from the surface 12.

The material of the metal layer 20 may be one or more suitable metals which will alter the conductivity type and/or the level of resistivity of the semiconductor material of the body 10. Additionally, the material of the layer 20 may include one or more metals which aid in migrating the metal through the body 10 without appreciably affecting the conductivity type or level of resistivity of the material comprising the body 10. However, such a metal may affect the lifetime characteristics of the material of the body 10. Suitable N-type dopant materials for silicon are phosphorus, arsenic and antimony. Suitable P-type dopant materials for silicon are boron, aluminum, gallium and indium. Metals which are suitable for acting as a carrier metal, and are considered intrinsic materials, that is, neither a P or an N-type dopant, are tin, gold, silver, and lead.

The layer 20 of metal is from one-half micron to 25 microns in thickness. Preferably, the thickness of layer 20 is from 3 to 5 microns. Should the layer 20 be less than ½ micron in thickness, insufficient wetting, of the material of the surface 12 of the body 10 may occur and migration may not be initiated. Should the layer 20 be greater than 25 microns in thickness, instability may occur.

Aluminum may be found to be a desirable metal for converting N-type silicon material to P-type material with a P-N junction formed by the abutting surfaces of opposite type conductivity material. It has been discovered that the vapor deposition of the layer 20 of aluminum metal should be performed at a pressure of approximately $1 \times 10^{-5}$ torr, but not greater than $5 \times 10^{-5}$ torr. When the pressure is greater than $3 \times 10^{-5}$ torr, we have found that in the case of aluminum metal deposited in the windows 18, the aluminum does not penetrate into the silicon and migrate through the body 10. It is believed that the layer of aluminum is saturated with oxygen and prevents good wetting of the contiguous surfaces of silicon. The initial melt of aluminum and silicon required for migration is not obtained because of the inability of aluminum atoms to diffuse into the silicon interface. In a like manner, aluminum deposited by sputtering is not desirable as the aluminum appears to be saturated with oxygen from the process. The preferred methods of depositing aluminum on the selected exposed surfaces of the silicon body 10 are by the electron beam method and the like wherein little, if any, oxygen can be trapped in the deposited aluminum.

Figure 4:
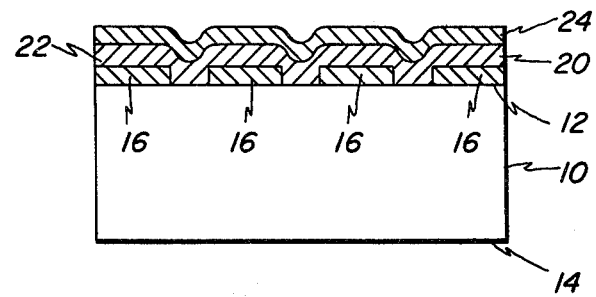
Figure 5:
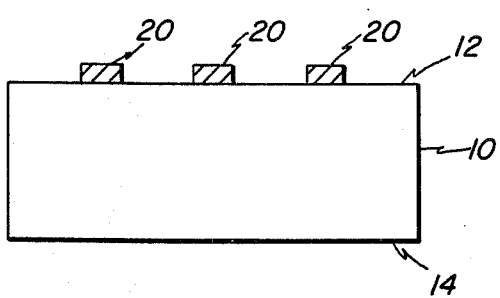

The excess metal of the layer 20 may be removed by photolithographical techniques embodying a second layer 24 of photoresist as indicated in FIG. 4. Masking, exposure to UV radiation, opening of windows in the layer 24, followed by selective etching of the aluminum and removal of the remainder of the photoresist of both layers 16 and 24, leaves the processed body 10 as shown in FIG. 5. Alternately, the processed body 10 of FIG. 10 is heated to about from 500° C to 550° C and the photoresist material is burned off the surface 12. In lifting the photoresist from the surface 12, the excess metal of the layer 20 is also removed. The metal of the layer 20 deposited in the exposed portions of the surface 12 adheres sufficiently to retain the metal deposited there in place. Any remnants of the layer 16 and 22 may be removed from the surface 12 by the expedient use of an adhesive tape, such, for example, as one sold under the trade name of Scotch, Tuck and the like. It is necessary to remove the excess material of the layers 16 and 20 since they may deleteriously affect the electrical characteristics of a device made by processing the body 10.

Figure 6:
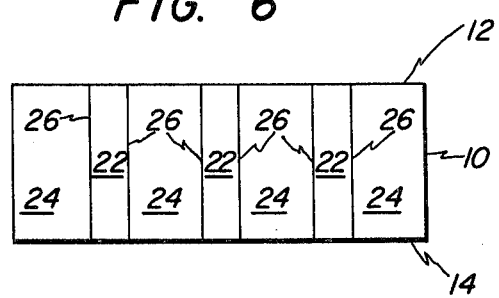

Referring now to FIG. 6, the processed body 10 is placed in a migration apparatus, not shown, and the metal wires 20 are migrated through the body 10 by a thermal gradient zone melting process. A thermal gradient of approximately 50° C per centimeter between the bottom surface 14, which is the hot face, and the surface 12, which is the cold face, has been discovered to be appropriate for an average temperature of the body 10 of from 700° C to 1350° C. The process is practiced for a sufficient length of time to migrate all the metal wires through the body 10. For example, for aluminum wires of 3 microns thickness, a thermal gradient of 50° C per centimeter, a temperature of the body 10 of 1200° C, a pressure of $1 \times 10^{-5}$ torr, a furnace time of 5 minutes is required to migrate the wires through a silicon body 10 of usual commercial wafer thickness of from 6 to 10 mils.

The temperature gradient zone melting process and apparatus is not a part of this invention. For a more thorough understanding of the temperature gradient zone melting process employed in this invention and for a more thorough description of the apparatus employed for the process, one is directed to the following copending applications and/or U.S. Patents, which are assigned to the same assignee of this invention: Method of Making Deep Diode Devices, Pat. No. 3,901,736; High Velocity Thermal Migration Method of Making Deep Diodes, U.S. Pat. No. 3,910,801; Deep Diode Devices and Method, and Apparatus Ser. No. 552,154 filed Jan. 24, 1975; High Velocity Thermomigration Method of Making Deep Diodes, U.S. Pat. No. 3,898,106; and Method, U.S. Pat. No. 3,902,925; and Stabilized Droplet Method of Making Deep Diodes Having Uniform Electrical Properties, U.S. Pat. No. 3,899,361, all of which are incorporated herein by reference thereto.

Upon completion of the temperature gradient zone melting process, the excess metal of the migrated metal wires is removed from the surface 14 preferably by selective etching. The surface 12 and 14 are selectively etched and polished and the resulting processed body 10 is as shown in FIG. 6.

The migration of the metal wires through the body 10 produces a body 10 having a plurality of spaced regions 22 of a second and opposite type conductivity than the body 10. Each region 22 is recrystallized material of the body 10 having solid solubility of the metal, including an impurity metal to dope the material, as required, therein of a concentration sufficient to obtain the desired type conductivity and level of resistivity.

The material of the regions 22 is not recrystallized material with liquid solubility of the impurity. Neither is it recrystallized material of eutectic composition. Each of the regions 22 has a substantially uniform resistivity throughout the entire region. The concentration of the metal, and impurity metal, is determined by the type of metal and/or impurity metal moved through the body 10, the semiconductor material, and the temperature at which the thermal gradient zone melting process is practiced. Suitable diagrams showing the solid solubility of different metals, including impurity metals, in various semiconductor materials, are well known to those skilled in the art. In particular, one may refer to FIG. 3.7 on Page 45 of the book entitled "Physics and Technology of Semiconductor Devices", by A. S. Grove, to determine the necessary temperature for migrating or making various metals, including impurity metals, through a solid body of silicon semiconductor material.

Each region 22 has a substantially constant uniform width and thickness for the entire region. Additionally, the top and bottom surfaces of each region 22 is coextensive with the respective top and bottom 12 and 14. Should a region 22 extend to the side surface 28 of the body 10, the side surface of the region 22 would be coextensive therewith.

Additionally, the body 10 is divided into a plurality of spaced regions 24 having the same, or first, type conductivity as the body 10. A P-N junction 26 is formed at the interface of the abutting surfaces of the material of the body 10 and the material of the region 22. The P-N junction 26 is well defined and shows and abrupt transition from the region of one type conductivity to the next adjacent region of opposite type conductivity. The abrupt transition produces a step P-N junction. A graded P-N junction 26 may be obtained by a post-diffusion treatment of the region 22 at a selected elevated temperature.

A pattern of aluminum wires, 10 microns in width, when migrated, produced regions 10 microns in width. We have found that apparently molten aluminum does not wet the (100) plane of silicon. Therefore, upon initial melting of the aluminum silicon of the surface region 12 dissolves into the aluminum melt and digs a natural groove for the melt of aluminum-rich silicon to be contained in until migration is initiated. Therefore, wire widths from about 10 microns to about 100 microns can be successfully migrated without the need of a silicon oxide, or other suitable material, mask, sintering, alloying or selectively etching the surface 12 to form trough-like depressions as previously believed to be necessary.

The thin regions being 10 microns, now make it possible to fabricate transistors by thermal gradient zone melting processing.

We have found that although the stable wire directions $< 011 >$ and $< 0\bar{1}1 >$ are ideally suitable for forming a grid structure for electrical isolation means one cannot yet successfully migrate the two wires simultaneously. A separate process for each wire direction is necessary, particularly when one wire is wider than the other intersecting wire. Apparently the force resulting from the surface tension of the two melts is still sufficient to separate the wires from each other at their intersection both at the surface 12 and inside the body 10 during migration.

With reference to FIGS. 7 and 8, there is shown an electrical isolation grid structure 50, which, because of the fineness of the migrated wires, of the order of 10 microns now possible, is particularly suited for memory arrays. The grid structure is achieved by further processing of the body 10. Those items denoted by the same reference numerals as in FIGS. 3 through 6, are the same as, and function in the same manner as, described heretofore. In particular, the plurality of first spaced planar regions 22 are disposed in the body 10 substantially parallel to each other. Preferably, for semiconductor device fabrication, each of the regions 22 is oriented substantially perpendicular to the top and bottom surfaces 12 and 14, respectively, and the peripheral side surface 28. Each of the regions 22 has a peripheral side surface which is coextensive with the respective surfaces 12, 14 and 28 of the body 10. A P-N junction 26 is formed by the contiguous surfaces of each region 22 and the immediately adjacent material of the body 10.

A plurality of second spaced planar regions 30 are disposed in the body 10 substantially parallel to each other. The regions 30 are formed in the same manner as the regions 22 except that the wire direction in the other of the two wire directions $< 011 >$ and $< 0\bar{1}1 >$ now used before. Preferably, for semiconductor device fabrication, each of the regions 30 is oriented substantially perpendicular to the respective top and bottom surfaces 12 and 14 and the side surface 28. In addition, each of the regions 30 is preferably perpendicular to, and intersects one or more of the plurality of first spaced planar regions 22. Each of the second planar regions 30 has a peripheral side surface which is coextensive with the surfaces 12, 14 and 28 of the body 10. A P-N junction 32 is formed by the contiguous surfaces of each region 30 and the immediately adjacent material of the body 10. The intersecting planar regions 22 and 30 define an egg-crate configuration which divides the body 10 into a plurality of third regions 24 of first type conductivity electrically isolated from each other.

Preferably, each of the regions 22 and 30 are of the same type conductivity, the conductivity being of a second, and opposite type than that conductivity of the body 10 and the regions 24.

The plurality of planar regions 22 and 30 electrically isolated each region 24 from all of the remaining regions 24 by the back-to-back relationship of the respective segments of the P-N junctions 26 and 32. The electrical isolation achieved by this novel egg crate design enables one to associate one or more semiconductor devices with one or more of the plurality of regions 24 of first type conductivity. The devices may be planar semiconductor devices 34 formed in mutually adjacent regions 24 and/or mesa semiconductor devices 36 formed on mutually adjacent regions 24 and still protect the electrical integrity of each device 28 or 30 without disturbing the mutually adjacent devices. Devices 34 and 36 may, however, be electrically interconnected to produce integrated circuits and the like.

Referring now to FIG. 9, the process which produced the structure of FIG. 6 may be altered to produce the structure as shown. The thermal gradient zone melting process is practiced until a predetermined distance $d$ from the surface 12 is reached. Then the thermal gradient is reversed and the molten zone moved through the body 10, substantially along the initial gradient and axis to the surface 12. The excess melt is removed in the same manner as described before relative to the surface 14.

The regions 22 and the P-N junctions 26 which are formed are the same as described relative to the structures of FIGS. 6 through 8.

The region 22 of FIG. 9 differs from that which is formed by ion implantation. Ion implantation is a Gaussian distribution of the impurity metal perpendicular to the surface 12. Therefore, the portion of the region 22 in the vicinity of portion 38 the P-N junction 26, which is substantially parallel to the surface 12, is a graded region. That is, with increasing depth from the surface 12, the level of impurity concentration decreases.

Referring now to FIG. 10, there is shown a device 100 which utilizes an alternate embodiment of the processed body 10. Instead of metal wires being migrated, one or more dots 112 of metal may be migrated. The process is the same as described heretofore relative to FIGS. 3 through 6, except that the mask is for one or more metal dots 112. The migration process produces regions 22 as before, the type of process producing regions entirely through the body 10 as in FIG. 6 or partly through the body 10 as in FIG. 9. The arrangement, as shown, is particularly suited for making an x-ray imaging device as described in abandoned patent application Ser. No. 411,020 of D. Cusano, filed Oct. 30, 1975 and assigned to the same assignee as this invention.

The configuration of the region 22 is rectangular, that is, a square in this instance.

A droplet migrates in the < 100 > crystal axis direction as a pyramid bounded by four forward (111) planes and a rear (100) plane. Careful control of the thermal gradient and migration rate is a necessity. Otherwise, a twisted region of recrystallized semiconductor material may result. It appears that there is a non-uniform dissolution of the four forward (111) facets in that they do not always dissolve at a uniform rate. Non-uniform dissolution of the four forward (111) facets may cause the regular pyramidal shape of the droplet to become distorted into a trapezoidal shape.

A droplet of metal-rich semiconductor material larger than 0.10 centimeter on an edge is unstable and breaks up into several droplets during migration. A droplet smaller than 0.0010 centimeter does not migrate into the body 10 because of a surface barrier problem.

The ratio of the droplet migration rate over the imposed thermal gradient is a function of the temperature at which the migration of the droplet is practiced. At high temperatures, of the order of from 1050° C to 1400° C, the droplet migration velocity increases rapidly with increasing temperature. A velocity of 10 centimeters per day or $1.2 \times 10^{-4}$ centimeter per second is obtainable for aluminum droplets in silicon.

The droplet migration rate is also affected by the droplet volume. In an aluminum-silicon system, the droplet migration rate decreases by a factor of two when the droplet volume is decreased by a factor of 200.

We claim as our invention:

1. An improved method for the migration of a molten zone through a solid body of semiconductor material to form a region comprising the process steps of:
    a. selecting a body of single crystal semiconductor material having two major opposed surfaces being respectively the top and bottom surface thereof; a preferred crystallographic structure; a planar orientation of (100) for which at least the top surface thereof, a first selective type conductivity; a selected level of resistivity, and a vertical axis substantially aligned with the < 100 > axis of the crystal structure and which is also substantially perpendicular to the top surface;
    b. depositing at least one mass of metal on the top surface of the body;
    c. heating the body and the deposited metal to a preselected elevated temperature sufficient to form a melt of a metal-rich semiconductor material therein;
    d. establishing a temperature gradient substantially parallel to the vertical axis of the body and the < 100 > axis of the crystal structure, the surface on which the melt is formed being at the lower temperature, and
    e. migrating each melt of metal-rich semiconductor material as a molten zone through the solid body of semiconductor material for a sufficient period of time to reach a predetermined depth in the body from the top surface and to form a region of recrystallized semiconductor material of the body having solid solubility of the deposited metal therein, a substantially uniform cross-sectional area and a substantially uniform level of resistivity throughout the entire region.

2. The method of claim 1 wherein
the semiconductor material of the body is one selected from the group consisting of silicon, silicon carbide, germanium and gallium arsenide.

3. The method of claim 2 wherein
the semiconductor material is silicon having N-type conductivity, and
the metal is aluminum.

4. The method of claim 3 wherein
the temperature gradient is from 50° C to 200° C per centimeter, and
the migration is practiced at a temperature of from 700° C to 1350° C.

5. The method of claim 1 wherein
each melt of metal is migrated through the entire body from the one major opposed surface to, and to terminate in, the other of the opposed major surfaces.

6. The method of claim 5 wherein
the semiconductor material of the body is one selected from the group consisting of silicon, silicon carbide, germanium and gallium arsenide.

7. The method of claim 6 wherein
the semiconductor material is silicon having N-type conductivity, and
the metal is aluminum.

8. The method of claim 7 wherein
the temperature gradient is from 50° C to 200° C per centimeter, and
the migration is practiced at a temperature of from 700° C to 1350° C.

9. The method of claim 1 wherein
each mass of metal has a wire-like geometrical configuration and is oriented in a direction substantially aligned with a crystal axis which is at least one selected from the group consisting of < 011 > and < 0$\overline{1}$1 >.

10. The method of claim 9 wherein
the semiconductor material of the body is one selected from the group consisting of silicon, silicon carbide, germanium and gallium arsenide.

11. The method of claim 10 wherein
the semiconductor material is silicon having N-type conductivity, and the metal is aluminum.
12. The method of claim 11 wherein
the temperature gradient is from 50° C to 200° C per centimeter, and
the migration is practiced at a temperature of from 700° C to 1350° C.
13. The method of claim 9 wherein
the semiconductor material of the body is one selected from the group consisting of silicon, silicon carbide, germanium and gallium arsenide.
14. The method of claim 13 wherein
the semiconductor material is silicon having N-type conductivity, and
the metal is aluminum.
15. The method of claim 14 wherein
the temperature gradient is from 50° C to 200° C per centimeter, and
the migration is practiced at a temperature of from 700° C to 1350° C.
16. The method of claim 9 wherein
the width of each wire is less than about 100 microns.
17. The method of claim 9 wherein
the width of each wire is of the order of 10 microns.
18. The method of claim 9 wherein
the metal is vapor deposited.
19. The method of claim 9 wherein
the deposited metal is substantially oxygen free.
20. The method of claim 1 wherein
the metal is vapor deposited.
21. The method of claim 1 wherein
the deposited metal is substantially oxygen free.

* * * * *